(12) United States Patent
Ko et al.

(10) Patent No.: US 8,692,327 B2
(45) Date of Patent: Apr. 8, 2014

(54) LATERAL DOUBLE DIFFUSED METAL OXIDE SEMICONDUCTOR DEVICE AND METHOD FOR MANUFACTURING THE SAME

(75) Inventors: Choul Joo Ko, Seoul (KR); Cheol Ho Cho, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 13/476,207

(22) Filed: May 21, 2012

(65) Prior Publication Data
US 2013/0093016 A1    Apr. 18, 2013

(30) Foreign Application Priority Data
Oct. 13, 2011    (KR) .................. 10-2011-0104532

(51) Int. Cl.
*H01L 29/78*    (2006.01)
*H01L 21/336*    (2006.01)

(52) U.S. Cl.
USPC ............ 257/343; 257/E29.256; 257/E21.409; 438/301

(58) Field of Classification Search
CPC ........................................... H01L 29/78
USPC ............ 257/343, E21.409, E29.256; 438/301
See application file for complete search history.

(56) References Cited

U.S. PATENT DOCUMENTS

| | | | |
|---|---|---|---|
| 6,924,531 B2 | 8/2005 | Chen et al. | |
| 7,605,040 B2 | 10/2009 | Choi et al. | |
| 2004/0084744 A1* | 5/2004 | Khemka et al. | 257/492 |
| 2005/0073007 A1* | 4/2005 | Chen et al. | 257/355 |
| 2005/0263843 A1* | 12/2005 | Sakakibara | 257/500 |
| 2007/0045767 A1* | 3/2007 | Zhu et al. | 257/505 |
| 2007/0264785 A1* | 11/2007 | Choi et al. | 438/297 |
| 2009/0236662 A1* | 9/2009 | Voldman | 257/337 |
| 2009/0302376 A1* | 12/2009 | Inoue et al. | 257/329 |
| 2010/0013012 A1* | 1/2010 | Cai | 257/343 |
| 2010/0140703 A1* | 6/2010 | Ko | 257/343 |
| 2012/0018804 A1* | 1/2012 | Khemka et al. | 257/337 |

FOREIGN PATENT DOCUMENTS

| | | |
|---|---|---|
| KR | 10-0859701 | 9/2008 |
| KR | 10-2010-0064262 | 6/2010 |

\* cited by examiner

*Primary Examiner* — Kevin Parendo
*Assistant Examiner* — Lamont Koo
(74) *Attorney, Agent, or Firm* — Sherr & Jiang, PLLC

(57) ABSTRACT

An LDMOS device may include at least one of a second conduction type buried layer and a first conduction type drain extension region. An LDMOS device may include a second conduction type drain extension region configured to be formed in a portion of the first conduction type drain extension region. The second conduction type drain extension region may include a gate pattern and a drain region. An LDMOS device may include a first conduction type body having surface contact with the second conduction type drain extension region and may include a source region. An LDMOS device may include a first guard ring formed around the second conduction type drain extension region. An LDMOS device may include a second guard ring configured to be formed around the first guard ring and configured to be connected to a different region of the second conduction type buried layer.

14 Claims, 7 Drawing Sheets

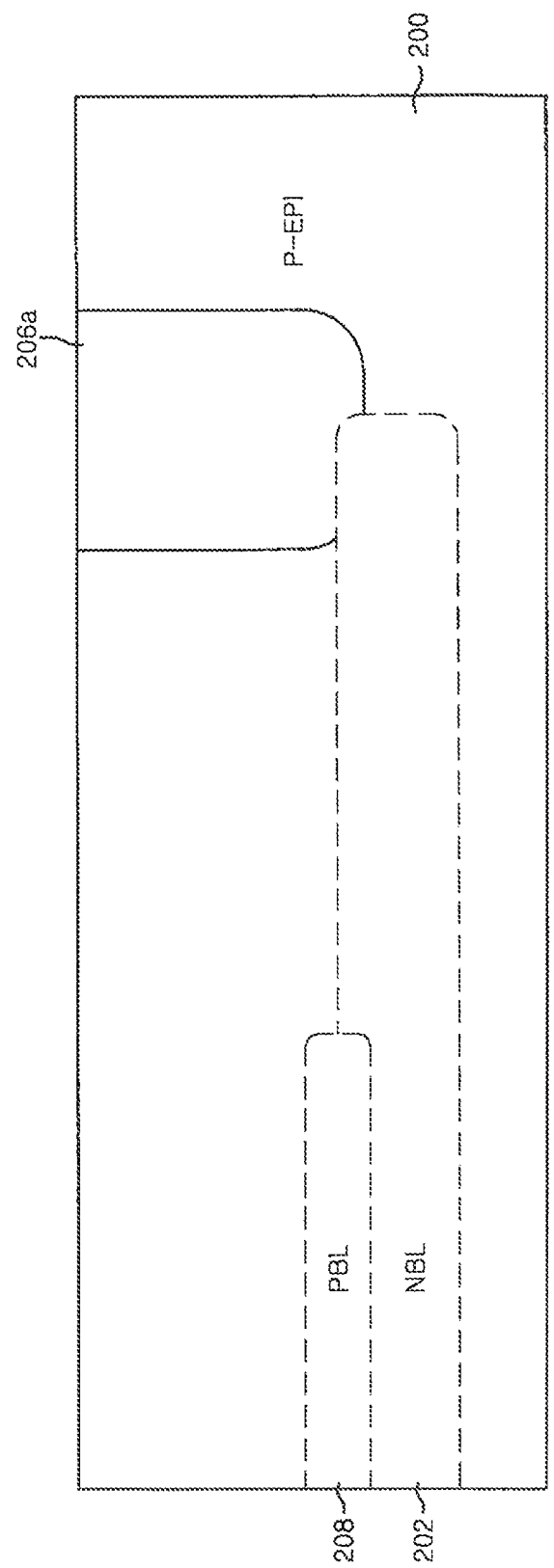

LATERAL DOUBLE DIFFUSED METAL OXIDE SEMICONDUCTOR DEVICE AND METHOD FOR MANUFACTURING THE SAME

The present application claims priority to Korean Patent Application No. 10-2011-0104532 (filed on Oct. 13, 2011), which is hereby incorporated by reference in its entirety.

BACKGROUND

As a result of improvements in the integration of semiconductor devices, including the development of manufacturing and design techniques, attempts have been made to construct systems using a single chip (i.e. one chip). Technique relating to one-chip systems have developed focusing on techniques for integrating a controller and circuits which operate with a low voltage on a single chip.

However, to reduce the weight and size of systems, it may be necessary to form a circuit unit that controls the power supply of the system. For example, input and output ports and a main circuit may be formed in a single chip. Since an input port and an output port may include circuits including high-voltage power transistors which receive a relatively high voltage, the input port and the output port may not rely solely on general low-voltage CMOS circuits.

Accordingly, in order to minimize the size and/or weight of a system, the input and output ports of a power supply and a controller may need to be formed in a single chip. A power IC technique may be implemented in which a high-voltage transistor and a low-voltage CMOS transistor circuit are formed in a single chip. A power IC technique may improve the structure of a VDMOS (Vertical DMOS) device, which is a discrete power transistor of the related art. A lateral DMOS (LDMOS) may be implemented in which a drain is arranged laterally to allow a current to flow laterally and a drift region may be arranged between the channel and the drain to secure high-voltage breakdown.

Aspects of a LDMOS device of the related art are described with reference to FIG. 1. FIG. 1 is a cross sectional view illustrating the structure of an LDMOS device in accordance with the related art. NBL (N-Buried Layer) 90 and HV NWELL (High Voltage N-WELL) 80 may be formed in semiconductor substrate P-SUB with an active region defined by field oxide film 60. HV NWELL (High Voltage N-WELL) 80 may be formed on. NBL 90.

Gate pattern 50 may be formed on/over the semiconductor substrate to overlap field oxide film 60. P-body 30 may be formed in HV NWELL (High Voltage N-WELL) 80 on one side of gate pattern 50. Source region 40 may be formed in P-body 30. LV NWELL (Low Voltage N-WELL) 70 may be formed in HV NWELL (High Voltage N-WELL) 80 on the other side of gate pattern 50. Drain region 10 may be formed in LV NWELL 70.

A related art LDMOS device may have a structure in which deep sink region (DEEPN+) 20 separated from drain region 10 by field oxide film 60 is used as a guard ring, thereby preventing or minimizing parasitic PNP operation. For example, if deep sink region 20 is used as a guard ring, when current flows backward in an inductor (i.e. when a hole current is generated), holes may recombine in NBL 90 and un-recombined holes may flow into deep sink region 20 to prevent the hole current from flowing into the substrate, thereby preventing or minimizing parasitic PNP operation.

In the related art, deep sink region 20 may be used as a guard ring in an LDMOS device of the related art and deep sink region 20 may be formed by a diffusion process using POCl3 (phosphorus oxychloride) or an ion implantation process. However, in the related art, a diffusion process using POCl3 (phosphorus oxychloride) or an ion implantation process or similar process may have a relatively long process time, which may contribute to relatively high costs.

SUMMARY

Embodiments relate to a technique for manufacturing a semiconductor device. Embodiments relate to an LDMOS device and a method for manufacturing an LDMOS device which remove a deep'sink region to prevent electrons from moving through a conductive buried layer and through a semiconductor substrate. Embodiments relate to an LDMOS device and a method for manufacturing an LDMOS device which includes a, guard ring including an impurity layer doped with first and second conduction type impurity ions between a guard ring (with the deep sink region removed) and a drain region, which may prevent electrons moving through a conductive buried layer from moving through a semiconductor substrate, which may simplify the manufacturing process and may reduce process time and cost.

In embodiments, an LDMOS device may include at least one of: (1) A second conduction type buried layer formed inside a first conduction type epitaxial layer. (2) A first conduction type drain extension region formed on/over a region of the second conduction type buried layer. (3) A second conduction type drain extension region formed in a partial region of the first conduction type drain extension region and including a gate pattern and a drain region. (4) A first conduction type body having a contact surface with the second conduction type drain extension region and including a source region. (5) A first guard ring formed around the second conduction type drain extension region and including a first conduction type impurity layer and second conduction type impurity layers formed on both sides of the first conduction type impurity layer. (6) A second guard ring formed around the first guard ring and connected to a different region of the second conduction type buried layer.

In embodiments, the first guard ring may include a first conduction type well for a guard ring formed inside the first conduction type epitaxial layer in a region where the first guard ring will be formed. The first conduction type well may be formed through a first conduction type impurity ion implantation process. A dummy region may be formed in the first conduction type well for a guard ring. The first conduction type impurity layer may be formed in the dummy region. In embodiments, the first drain conduction type drain extension region, the first guard ring, and the second guard ring may be separated from each other by a field oxide film.

In embodiments, an LDMOS device may include a first conduction type buried layer which is formed between the first conduction type drain extension region and the second conduction type buried layer. A second guard ring may include a high-voltage second conduction type well, a second conduction type well, and an N+ region, in accordance with embodiments.

Embodiments relate to a method for manufacturing an LDMOS device may include at least one of: (1) Forming a first conduction type epitaxial layer on/over a semiconductor substrate and forming a second conduction type buried layer in the first conduction type epitaxial layer. (2) Forming a first conduction type drain extension region on/over a region of the second conduction type buried layer. (3) Forming a first conduction type body through a first conduction type impurity ion implantation process in a partial region of the first conduction type drain extension region where a source region is to be formed. (4) Forming a second conduction type drain extension region through a second conduction type impurity ion implantation process in the part of the first conduction type drain extension region which is connected to the first conduction type body in which a drain region and a gate pattern will be formed. (5) Forming a first guard ring around the second conduction type drain extension region, the first guard ring including a first conduction type impurity layer and second conduction type impurity layers formed on both sides of the first conduction type impurity layer. (6) Forming a second guard ring around the first guard ring through a first conduction type impurity ion implantation process.

In embodiments, the forming of the first guard ring may include at least one of the following: (1) Forming a first conduction type well for a guard ring through a first conduction type impurity ion implantation process inside the first conduction type epitaxial layer in a region where the first guard ring is to be formed. (2) Forming a dummy region in the first conduction type well for a guard ring. (3) Forming the first conduction type impurity layer in the dummy region through a first conduction type impurity ion implantation process. (4) Forming the first guard ring including the second conduction type impurity layers, the first conduction type impurity layer, and the first conduction type well for a guard ring through a second conduction type impurity ion implantation process on both sides of the first conduction type impurity layer.

In embodiments, the forming of the second guard ring may include at least one of (1) Forming a high-voltage second conduction type well through a second conduction type impurity ion implantation process in a partial region around the first guard ring. (2) Forming a second conduction type well in the second conduction type well. (3) Forming an N+ region in the second conduction type well to form the second guard ring including the high-voltage second conduction type well, the second conduction type well, and the N+ region.

In embodiments, a method may include, after forming the second conduction type buried layer, implanting first conduction type impurity ions in an upper part of a region of the second conduction type buried layer to form a first conduction type buried layer.

In accordance with embodiments, with the use of the guard ring including an impurity layer sequentially doped with first and second conduction type impurity ions outside the drain region and the guard ring with a deep sink region (DEEPN+) removed, it is possible to prevent/minimize electrons from moving inside the semiconductor substrate, which may simplify a fabrication process with a deep sink region removed, which may reduce process time and/or cost.

Objects of embodiments are not limited to those mentioned above and other objects of embodiments will be apparent to those skilled in the art taken in conjunction with the following description.

BRIEF DESCRIPTION OF THE DRAWINGS

The above and other features of embodiments will become apparent from the following description of embodiments given in conjunction with the accompanying drawings, in which:

FIGS. 4A to 4D are cross sectional views illustrating processes for manufacturing an LDMOS device, in accordance with embodiments.

DESCRIPTION

Figure 1:
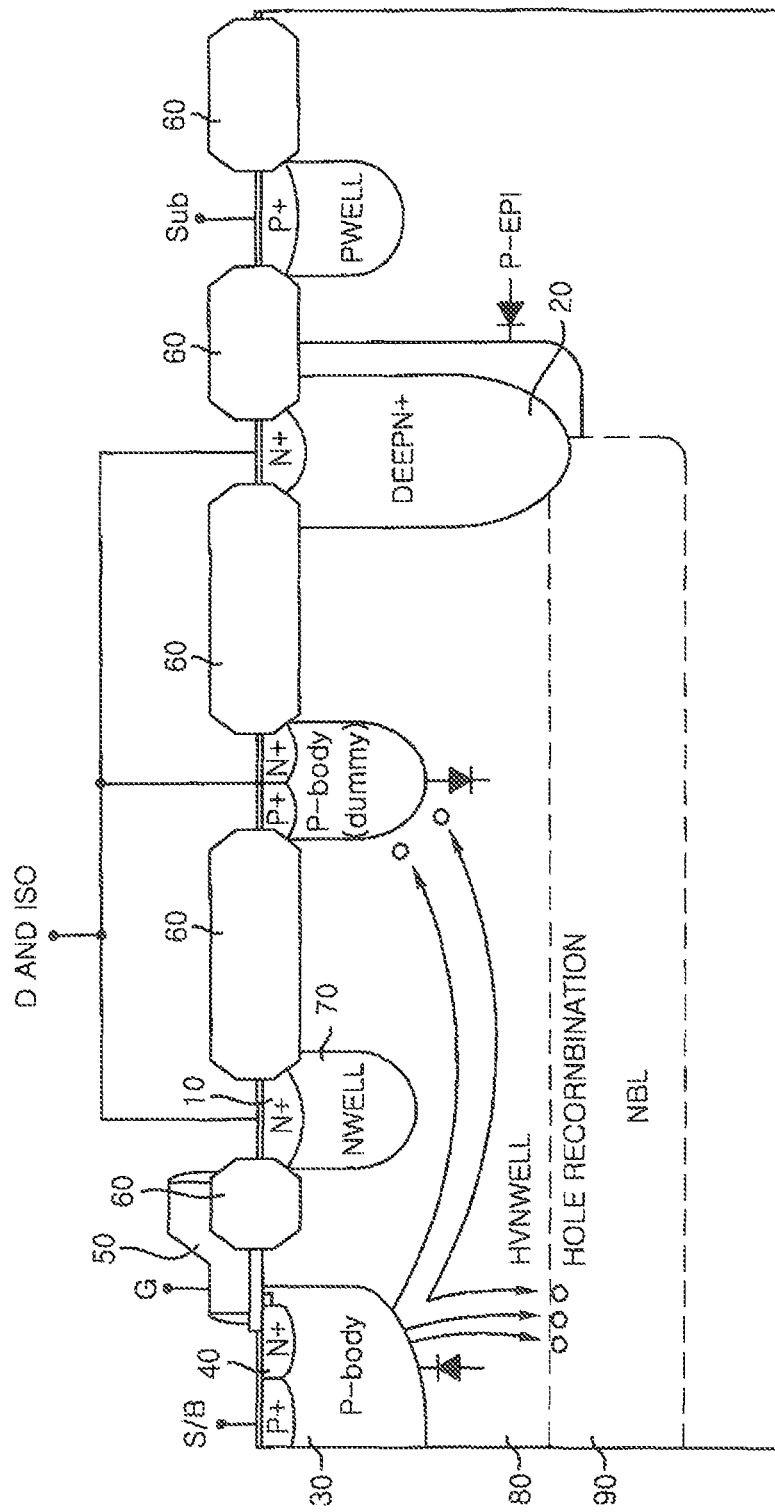
FIG. 1 is a cross sectional view illustrating the structure of an LDMOS device of the related art.

Advantages and features of embodiments and methods of accomplishing the same may be understood more readily by reference to the following detailed description of embodiments and the accompanying drawings. The embodiments may, however, be embodied in many different forms and should not be construed as being limited to the embodiments set forth herein. Rather, these embodiments are provided so that this disclosure will be thorough, and complete and will fully convey the concept of the embodiments to those skilled in the art, and the embodiments will only be defined by the appended claims. Like reference numerals refer to like elements throughout the specification.

Hereinafter, an LDMOS device and a method for manufacturing an LDMOS device in accordance with embodiments will be described in detail with reference to the accompanying drawings.

Figure 2:
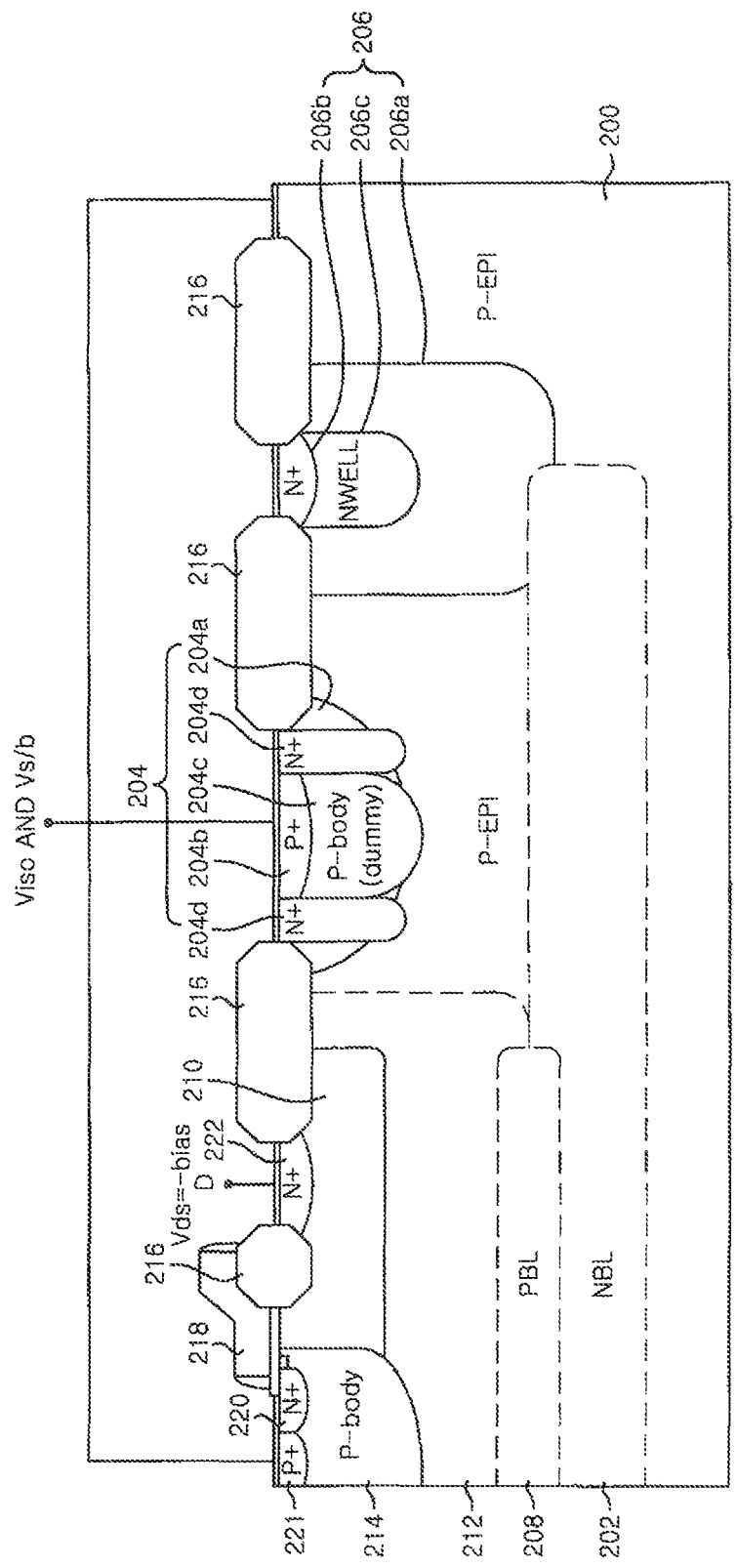
FIG. 2 is a cross sectional view illustrating the structure of an LDMOS device, in accordance with embodiments.

FIG. 2 is a sectional view illustrating the structure of a low-side LDMOS device, in accordance with embodiments. An LDMOS device in accordance with embodiments may include at least one of: (1) First conduction type epitaxial layer 200. (2) Second conduction type buried layer 202. (3) First guard ring 204. (4) Second guard ring 206. (5) First conduction type buried layer 208. (6) Second conduction type drain extension region 210. (7) First conduction type drain extension region 212. (8) First conduction type body 214. (9) Field oxide film 216. (10) Gate pattern 218. (11) Source region 220. (12) Drain region 222.

In embodiments, the first conduction type may be P-type impurity ions and the second conduction type may be N-type impurity ions.

In embodiments, first conduction type epitaxial layer 200 may be grown on a semiconductor substrate. Second conduction type buried layer 202 and first conduction type buried layer 208 may be formed in first conduction type epitaxial layer 200. First conduction type buried layer 208 may be formed in first conduction type epitaxial layer 200 on/over a region of second conduction type buried layer 202.

In embodiments, first guard ring 204 may formed in a region adjacent to drain region 222 to suppress current leakage from drain region 222 toward the semiconductor substrate. First conduction type well 204a may be formed in a region adjacent to drain region 222, in accordance with embodiments. First conduction type well 204a may include dummy region 204c, in accordance with embodiments. Dummy region 204c may include P-type impurity layer 204b doped with high-concentration P-type (P+) ions and N-type impurity layers 204d doped with high-concentration N-type (N+) ions on both sides of P-type impurity layer 204b.

In embodiments, second guard ring 206 may be formed in a region adjacent to first guard ring 204. Field insulating film 216 may be arranged between first guard ring 204 and second guard ring 206, in accordance with embodiments. Second guard ring 206 may be connected to at least a portion of second conduction type buried layer 202, in accordance with embodiments.

In embodiments, second guard ring 206 may include high-voltage second conduction type well 206a. Second conduction type well 206c may be doped with. high-concentration N-type (N+) impurity ions. Second conduction type well 206c may be connected to an N+ region 206b and may be included in high-voltage second conduction type well 206a. Second guard ring 206 may reduce leakage current and/or may improve SOA (Safe Operating Area) along with first guard ring 204, in accordance with embodiments.

First conduction type drain extension region 212 and the second conduction type drain extension region 210 may be formed by a drive-in process using one ion implantation mask, in accordance with embodiments. In embodiments, the drive-in process may include at least one of the following: (1) After an ion implantation mask is formed (which may expose an upper part of first conduction type epitaxial layer 200 corresponding to first conduction type drain extension region 212 and second conduction type drain extension region 210), a first conduction type impurity ion implantation process may be performed. (2) Then a second conduction type impurity ion implantation process may be performed.

When an LDMOS device in accordance with embodiments is connected to a high or low side, a PN junction may be formed and turned on between first conduction type drain extension region 212 and second conduction type drain extension region 210, thereby preventing holes or electrons from entering the semiconductor substrate. In embodiments, when an LDMOS device is used on the high side, the PN junction may be turned on between first conduction type drain extension region 212 and second conduction type drain extension region 210. Accordingly, electrons which are generated in first conduction type drain extension region 212 may move to first conduction type buried layer 208. Electrons which are generated in second conduction type drain extension region 210 may be combined with holes in first conduction type epitaxial layer 200 and holes in the first conduction type body 214. Accordingly, in embodiments, holes may be prevented, substantially prevented, and/or minimized from flowing to a semiconductor substrate.

In embodiments, when an LDMOS device is used on the low side, electrons which are generated in first conduction type drain extension region 212 may move to second conduction type buried layer 202. Electrons which are generated in second conduction type drain extension region 210 may be combined with holes in first conduction type epitaxial layer 200 and holes in first conduction type body 214. Accordingly, in embodiments, electrons may be prevented, substantially prevented, and/or minimized from entering a semiconductor substrate.

First conduction type body 214 may include source region 220 and P+ region 221 provided on one side of gate pattern 218. Drain region 222 may be provided on the other side of gate pattern 218.

Voltage Vs/b may be applied to first conduction type body 214 and source region 220 of an LDMOS device, in accordance with embodiments. Voltage Vds may be applied to drain region 222. Isolation voltage Viso may be applied to first guard ring 204 and second guard ring 206.

In LDMOS devices, operations may be implemented that prevent, substantially prevent, and/or minimize electrons from entering a semiconductor substrate using first guard ring 204 and second guard ring 206, in accordance with embodiments.

As illustrated in FIG. 2, in an LDMOS device in accordance with embodiments, when voltage Vds is applied to drain region 222 is a negative bias (−bias), 0 V is applied to first guard ring 204 and second guard ring 206 (as the isolation voltage Viso), and 0 V is applied to source region 220 (as source voltage Vs/b), a PN junction may be forwarded only inside the semiconductor substrate, such that electrons do not enter the semiconductor substrate. For example, in embodiments, when a PN, junction between second conduction type drain extension region 210 and first conduction type drain extension region 212 is turned on, electrons which are generated in second conduction type drain extension region 210 may move to second conduction type buried layer 202 and electrons which move through second conduction type buried layer 202 may move to N-type impurity layer 204d of first guard ring 204 and second guard ring 206, which may thereby prevent electrons from entering a semiconductor substrate.

Figure 3:
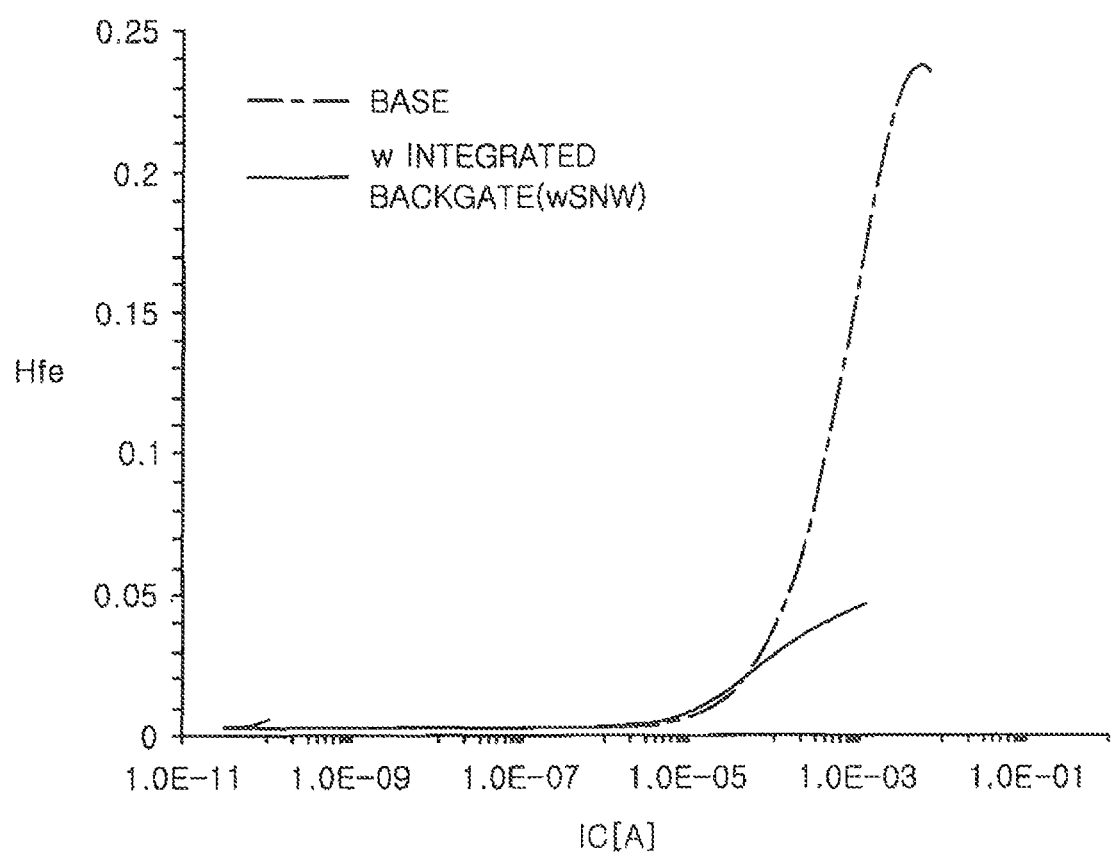
FIG. 3 is a diagram illustrating a comparison result of a current gain Hfe of parasitic PNP measured in an LDMOS device and a current gain in the related art during LDMOS operation, in accordance with embodiments.

A current gain Hfe of parasitic PNP may be measured in an LDMOS device in accordance with embodiments, as illustrated in example FIG. 3. From example FIG. 3, it is understood that the current gain in the LDMOS device is relatively low compared to a related art LDMOS device (e.g. illustrated in FIG. 1) in which a hole guard ring is provided using a second conduction type deep sink region, in accordance with embodiments.

A process for manufacturing an LDMOS device is illustrated with reference to FIGS. 4A to 4D, in accordance with embodiments. FIGS. 4A to 4D are cross sectional views illustrating each process for manufacturing an LDMOS device, in accordance with embodiments.

As illustrated in FIG. 4A, first conduction type epitaxial layer 200 may be grown on/over a semiconductor substrate. Second conduction type impurity ions (e.g. N-type impurity ions) may be implanted into first conduction type epitaxial layer 200 to form second conduction type buried layer 202. A region of first conduction type epitaxial layer 200 may be exposed and first conduction type impurity ions may be implanted to form first conduction type buried layer 208. Another region of first conduction type epitaxial layer 200 may be exposed and second conduction type impurity ions for forming second guard ring 206 may be implanted to form high-voltage second conduction type well 206a. High-voltage second conduction type well 206a may be formed to be connected to a partial region of second conduction type buried layer 202 and first conduction type buried layer 208 may be formed to be connected to a partial region of second conduction type buried layer 202. This process may be performed using a photoresist pattern which is formed through a photolithography process. The photoresist pattern may be removed by ashing or stripping after first conduction type buried layer 208 and high-voltage second conduction type well 206a are formed.

Figure 4B:
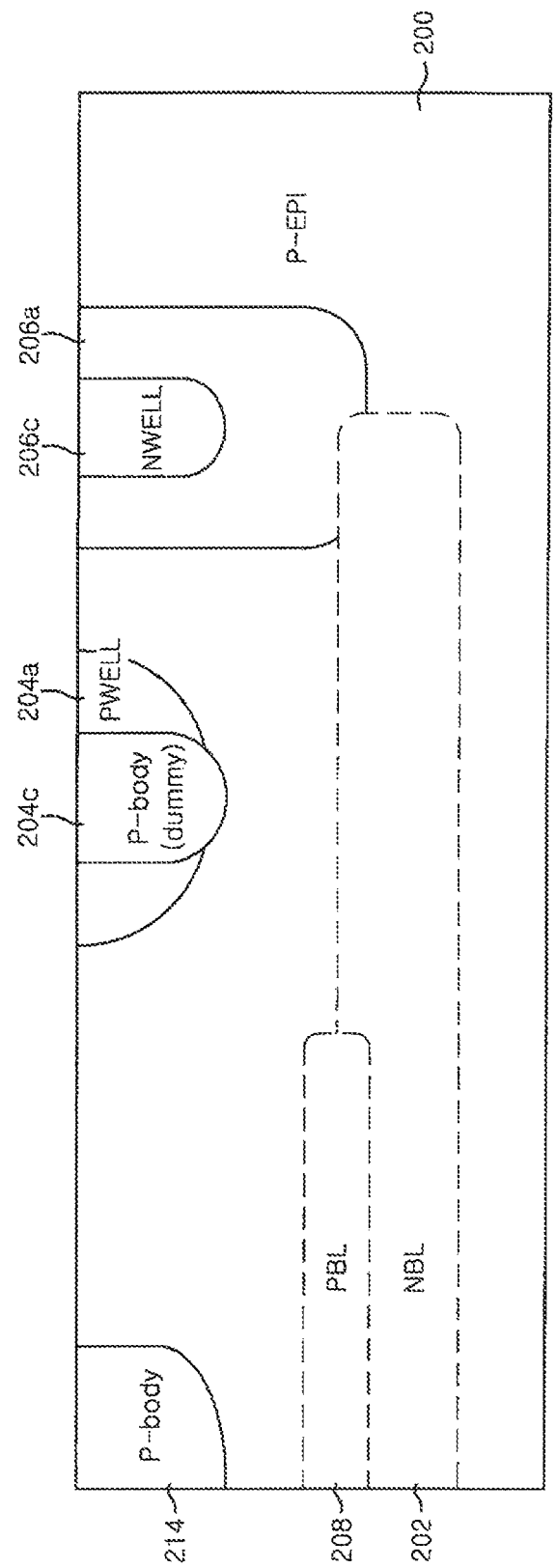

As illustrated in. FIG. 4B, according to embodiments, a first conduction type impurity ion implantation process may be performed in a partial region of first conduction type epitaxial layer 200 to form first conduction type body 214 and first conduction type well 204a of first guard ring 204. A second conduction type impurity ion implantation process may be performed in a partial region of first conduction type epitaxial layer 200 (i.e. in a portion of the region where high-voltage second conduction type well 206a is formed) to form second conduction type well 206c. First conduction type impurity ions may be implanted into first conduction type well 204a to form dummy region 204c doped with a first conduction type impurity.

Figure 4C:
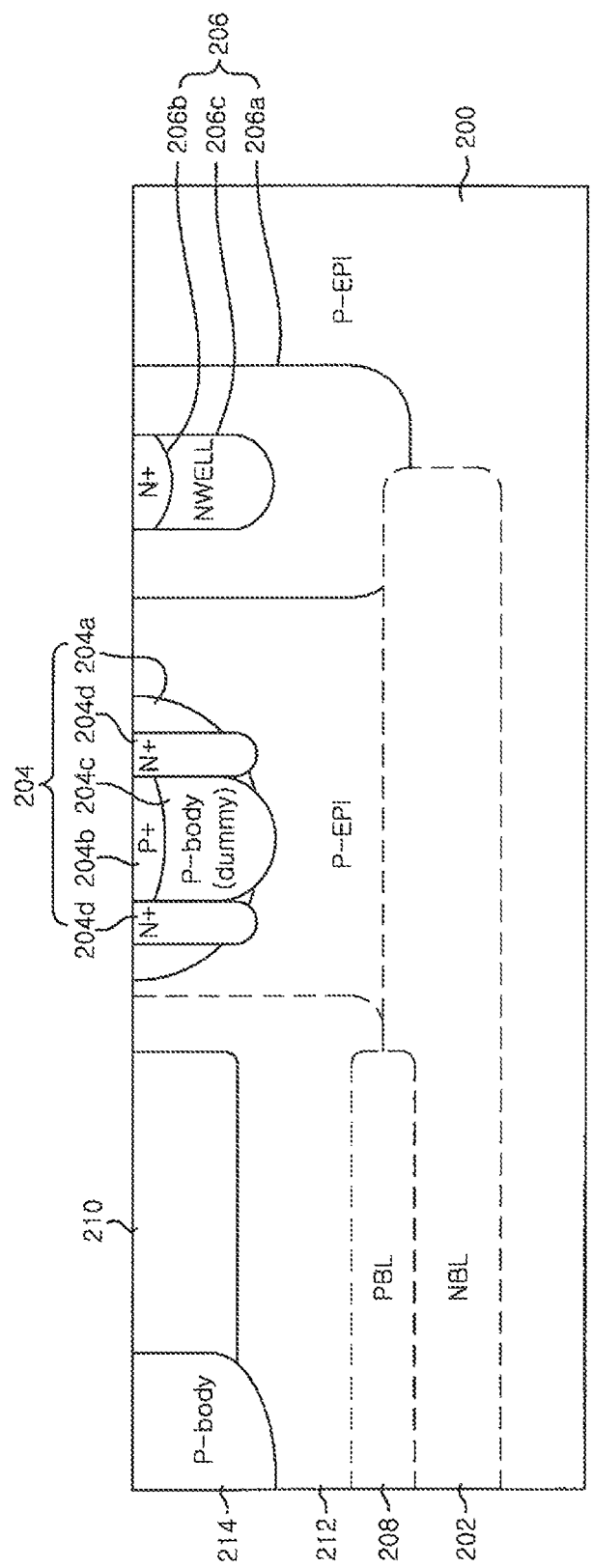

As illustrated in. FIG. 4C, according to embodiments, a photoresist pattern is formed which may expose another region of first conduction type epitaxial layer 200 (e.g. a region including portions where gate pattern 218 and drain region 222 will be formed). A first conduction type impurity ion implantation process may be performed in the region exposed from the photoresist pattern to implant a first conduction type impurity into the first conduction type epitaxial layer 200 on the first conduction type buried layer 208 forming first conduction type drain extension region 212. A second conduction type impurity ion implantation process may be performed using the same ion implantation mask (i.e. a photoresist pattern to implant a second conduction type impurity into first conduction type epitaxial layer 200 exposed through the photoresist pattern) to form second conduction type drain extension region 210. First conduction type drain extension region 210 and second conduction type drain extension region 212 may be determined by the size of the exposed surface of the photoresist pattern and may be formed through a drive-in process. The photoresist pattern may be removed by ashing or stripping. With this example manufacturing process, the one lateral surface of first conduction type body 214 may have a contact surface with first conduction type drain extension region 212 and second conduction type drain extension region 210.

A high-concentration P-type (P+) impurity ion implantation process may be performed in dummy region 204c to form P-type impurity layer 204b. An ion implantation mask which may expose both sides of P-type impurity layer 204b may be formed and a high-concentration N-type (N+) impurity ion implantation process may be performed using the ion implantation mask to form N-type impurity layers 204d on both sides of P-type impurity layer 204b.

Figure 4D:
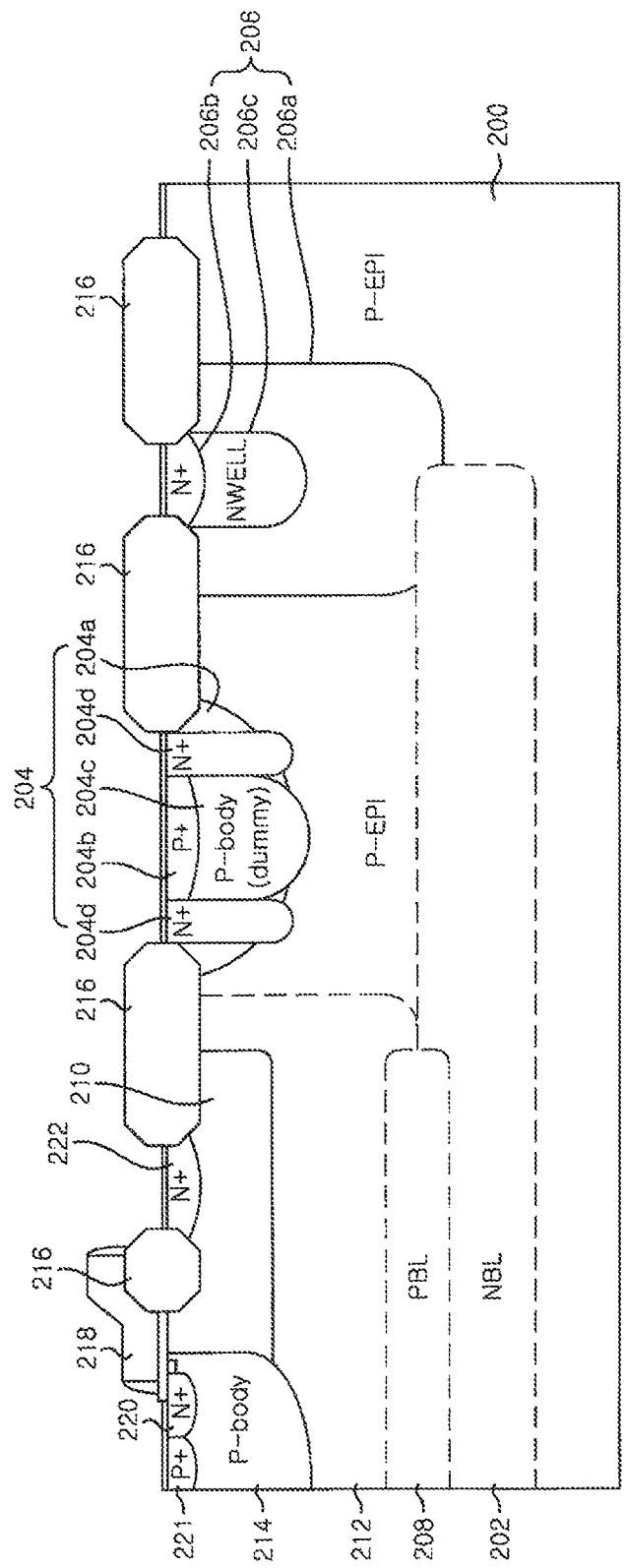

As illustrated in FIG. 4D, in accordance with embodiments, field oxide film 216 may be formed in a partial region of first conduction type epitaxial layer 200 (e.g. in an active region and a field region). Gate pattern 218 may be formed in the active region exposed from field oxide film 216. Source region 220, drain region 222, and P+ region 221 connected to source region 220 may be formed through an impurity ion implantation process.

In accordance with embodiments, with the use of first guard ring 204 including first conduction type well 204a, P-type impurity layer 204b, dummy region 204c, N-type impurity layer 204d, and second guard ring 206 with a deep sink region (DEEPN+) may be removed. In accordance with embodiments, it may be possible to prevent electrons from moving into a semiconductor substrate, thereby simplifying a process and reducing process time and cost.

While the invention has been shown and described with respect to the embodiments, the present invention is not limited thereto. It will be understood by those skilled in the art that various changes and modifications may be made without departing from the scope of the invention as defined in the following claims.

What is claimed is:

1. An LDMOS device comprising:
   a second conduction type buried layer formed inside a first conduction type epitaxial layer;
   a first conduction type drain extension region formed over at least a portion of said second conduction type buried layer;
   a second conduction type drain extension region formed in a portion of said first conduction type drain extension region, wherein said second conduction type drain extension region comprises a gate pattern and a drain region;
   a first conduction type body in surface contact with said second conduction type drain extension region, wherein said first conduction type body comprises a source region;
   a first guard ring formed around said second conduction type drain extension region, wherein said first guard ring comprises a first conduction type impurity layer and a second conduction type impurity layer, wherein said second conduction type impurity layer is formed on both sides of said first conduction type impurity layer; and
   a second guard ring formed around the first guard ring, wherein said second guard ring is connected to a different region of the second conduction type buried layer than said first conduction type drain extension region.

2. The LDMOS device of claim 1, wherein said first conduction type drain extension region is formed on a portion of said second conduction type buried layer.

3. The LDMOS device of claim 1, wherein said first guard ring comprises:
   a first conduction type well formed inside said first conduction type epitaxial layer in a region where said first guard ring will be formed through a first conduction type impurity ion implantation process;
   a dummy region formed in the first conduction type well of said first guard ring; and
   the first conduction type impurity layer formed in said dummy region.

4. The LDMOS device of claim 1, wherein the first conduction type drain extension region, the first guard ring, and the second guard ring are separated from each other by at least one field oxide film.

5. The LDMOS device of claim 1, comprising a first conduction type buried layer formed between the first conduction type drain extension region and the second conduction type buried layer.

6. The LDMOS device of claim 1, wherein the second guard ring comprises a high-voltage second conduction type well, a second conduction type well, and an N+ region.

7. A method for manufacturing an LDMOS device, wherein the method comprising:
   forming a first conduction type epitaxial layer over a semiconductor substrate;
   forming a second conduction type buried layer in said first conduction type epitaxial layer;
   forming a first conduction type drain extension region over at least a portion of the second conduction type buried layer;
   forming a first conduction type body through a first conduction type impurity ion implantation process in at least a portion of the first conduction type drain extension region where a source region is to be formed;
   forming a second conduction type drain extension region through a second conduction type impurity ion implantation process in a portion of the first conduction type drain extension region which is connected to the first conduction type body and in which a drain region and a gate pattern will be formed;
   forming a first guard ring around the second conduction type drain extension region, wherein the first guard ring comprises a first conduction type impurity layer and a second conduction type impurity layer formed on both sides of said first conduction type impurity layer; and
   forming a second guard ring around the first guard ring through a first conduction type impurity ion implantation process.

8. The method of claim 7, wherein said first conduction type epitaxial layer is formed on the semiconductor substrate.

9. The method of claim 7, wherein said first conduction type drain extension region is formed on said at least a portion of said second conduction type buried layer.

10. The method of claim 7, wherein said forming said first guard ring comprises:
    forming a first conduction type well for said first guard ring through a first conduction type impurity ion implantation process inside said first conduction type epitaxial layer in a region where said first guard ring is to be formed;

forming a dummy region in the first conduction type well as part of said first guard ring;

forming said first conduction type impurity layer in said dummy region through a first conduction type impurity ion implantation process, and forming said first guard ring including said second conduction type impurity layer, said first conduction type impurity layer, and said first conduction type well for said first guard ring through a second conduction type impurity ion implantation process on both sides of said first conduction type impurity layer.

11. The method of claim 7, wherein said forming the second guard ring comprises:

forming a high-voltage second conduction type well through a second conduction type impurity ion implantation process in a region surrounding said first guard ring, forming a second conduction type well in said second conduction type well; and forming an N+ region in the second conduction type well to form said second guard ring, wherein said second guard ring comprises said high-voltage second conduction type well, said second conduction type well, and said N+ region.

12. The method of claim 7, comprising:

after forming said second conduction type buried layer, implanting first conduction type impurity ions in an upper portion of a region of said second conduction type buried layer to form a first conduction type buried layer.

13. The LDMOS device of claim 1, wherein:

the first conduction type is P-type;

the second conduction type is N-type; and

P-type and N-type are different conduction types.

14. The method for manufacturing an LDMOS device of claim 7, wherein:

the first conduction type is P-type;

the second conduction type is N-type; and

P-type and N-type are different conduction types.

* * * * *